United States Patent
Sasamura et al.

(10) Patent No.: US 8,033,397 B2
(45) Date of Patent: Oct. 11, 2011

(54) COVER TAPE FOR PACKAGING SEMICONDUCTOR DEVICE AND PACKAGE FOR SEMICONDUCTOR DEVICE

(75) Inventors: Keiichi Sasamura, Kawasaki (JP); Kenichi Yazaki, Kawasaki (JP); Yuuzou Hamanaka, Kawasaki (JP); Yukio Ando, Kawasaki (JP); Hideyasu Hashiba, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 533 days.

(21) Appl. No.: 11/541,727

(22) Filed: Oct. 3, 2006

(65) Prior Publication Data
US 2007/0216000 A1 Sep. 20, 2007

(30) Foreign Application Priority Data
Mar. 16, 2006 (JP) .................... 2006-073586

(51) Int. Cl.
B65D 85/00 (2006.01)
H01L 23/02 (2006.01)
(52) U.S. Cl. .................... 206/714; 257/678; 206/713
(58) Field of Classification Search ............ 206/714, 206/713, 725, 820, 724; 428/141, 156, 343, 428/43, 208.6; 442/2, 44, 149, 150, 151, 442/3, 43; 257/678, 680; 139/407
See application file for complete search history.

(56) References Cited

U.S. PATENT DOCUMENTS

| | | | | |
|---|---|---|---|---|
| 2,308,693 A | * | 1/1943 | Goldman | 139/407 |
| 2,508,855 A | * | 5/1950 | Brown | 428/43 |
| 4,304,813 A | * | 12/1981 | Elmore, Jr. | 442/313 |
| 4,849,857 A | * | 7/1989 | Butt et al. | 361/708 |
| 5,691,038 A | * | 11/1997 | Hirata et al. | 428/194 |
| 5,931,337 A | * | 8/1999 | Ando et al. | 221/1 |
| 6,107,680 A | * | 8/2000 | Hodges | 257/680 |
| 6,216,419 B1 | * | 4/2001 | Sakurai | 53/139.5 |
| 6,218,017 B1 | * | 4/2001 | Yamashita et al. | 428/424.2 |
| 6,225,386 B1 | * | 5/2001 | Suzuki | 524/154 |
| 6,357,594 B1 | * | 3/2002 | Gutentag | 206/714 |

(Continued)

FOREIGN PATENT DOCUMENTS

| | | |
|---|---|---|
| JP | 57-42972 A | 3/1982 |
| JP | 4-31215 A | 2/1992 |
| JP | 5-57899 U | 7/1993 |

(Continued)

OTHER PUBLICATIONS

Japanese Office Action dated Apr. 19, 2011, for Japanese Patent Application No. 2006-073586.

Primary Examiner — J. Gregory Pickett
Assistant Examiner — Ernesto Grano
(74) Attorney, Agent, or Firm — Westerman, Hattori, Daniels & Adrian, LLP

(57) ABSTRACT

The present invention provides a cover tape for packaging a semiconductor device which protects the outer shape of the semiconductor device, and is capable of improving the mounting speed of the semiconductor device by shipment in tape, and a package for the semiconductor device using the cover tape for packaging the semiconductor device. The cover tape for packaging the semiconductor device has a net-shaped structure at least in a portion, and the cover tape for packaging the semiconductor device is pasted onto an embossed tape which has a number of pockets containing semiconductor devices. The package for the semiconductor device contains an embossed tape which has a number of pockets which contain semiconductor devices, and the cover tape for packaging the semiconductor device.

12 Claims, 4 Drawing Sheets

U.S. PATENT DOCUMENTS

| | | | |
|---|---|---|---|
| 6,425,484 B1 * | 7/2002 | Sakurai | 206/714 |
| 6,467,627 B1 * | 10/2002 | Troxtell, Jr. | 206/714 |
| 6,469,372 B2 * | 10/2002 | Hayden et al. | 257/679 |
| 6,545,754 B2 * | 4/2003 | Her | 356/237.5 |
| 6,823,652 B2 * | 11/2004 | Troxtell, Jr. | 53/427 |
| 2001/0055928 A1 * | 12/2001 | Eevers et al. | 442/394 |
| 2003/0129389 A1 * | 7/2003 | Ichikawa et al. | 428/343 |

FOREIGN PATENT DOCUMENTS

| | | |
|---|---|---|
| JP | 6-239381 A | 8/1994 |
| JP | 2000-128230 A | 5/2000 |
| JP | 2002-211637 A | 7/2002 |
| JP | 2005-35636 A | 2/2005 |
| JP | 2005-132421 A | 5/2005 |

* cited by examiner

COVER TAPE FOR PACKAGING SEMICONDUCTOR DEVICE AND PACKAGE FOR SEMICONDUCTOR DEVICE

CROSS-REFERENCE TO RELATED APPLICATIONS

This application is based upon and claims the benefits of the priority from the prior Japanese Patent Application No. 2006-073586, filed on Mar. 16, 2006, the entire contents of which are incorporated herein by reference.

BACKGROUND OF THE INVENTION

1. Field of the Invention

The present invention relates to a cover tape for packaging semiconductor device which ensures quality and reliability of a semiconductor device by protecting the outer shape of the semiconductor device, and is capable of improving the mounting speed of the semiconductor device by shipment in tape, and a package for semiconductor device using the cover tape for packaging semiconductor device.

2. Description of the Related Art

The shipment in embossed tape has been employed as a delivering embodiment of a semiconductor device for mounting the semiconductor device on a substrate. In the shipment in embossed tape, the semiconductor device is delivered packaged in a package which contains an embossed tape on which pockets for containing the semiconductor device are formed in accordance with the shape of the semiconductor device such as LSIs, etc. and a cover tape which packs the embossed tape. The semiconductor device contained in the package is taken out after the cover tape is peeled off and mounted on a surface of the substrate automatically. Because the embossed tape is advantageous in being able to transport the semiconductor device such as LSIs, etc. in large quantity and in enabling high-speed mounting of the semiconductor device on a substrate by users, the demand for shipment in embossed tape is growing in recent years.

However, with a progress of polarization (grow in size and downsizing) of semiconductor devices, small, thin and light electronic components such as CSP/CHIP, etc. are being shipped or mounted in tray because shipment in embossed tape is difficult due to manufacturing of the embossed tape which makes the high-precision processing impossible.

The shipment in tray has a problem in mounting speed which is two to three times slower compared to that of the shipment in tape because of the delay caused by the use of intermediate table when a general-purpose mounting device is used. Moreover, there are two types of mounting device: general-purpose type which is applicable for both shipments in tray and tape and high-speed type which is applicable only for shipment in tape. The mounting device of high-speed type has a problem that it is not applicable for shipment in tray.

Therefore, it is necessary to improve the embossed tape and to realize the use of the high-speed mounting device by shipment in embossed tape in order to realize high-speed mounting of the semiconductor device.

For example, a tape wound on a reel as shown in FIG. 1A is known as the embossed tape. An enlarged view of the embossed tape in X portion surrounded by dashed line in FIG. 1A is shown in FIG. 1B and a cross-sectional view is shown in FIG. 1C. As shown in FIG. 1C, semiconductor devices, IC chips 110 are packed in a package containing an embossed tape 100 on which pockets 100A which contain the IC chips 110 are formed and a cover tape 120 which packs the embossed tape 100. The IC chips 110 contained in the pockets 100A are transported in high speed, and taken out after the cover tape 120 is peeled off in high speed during mounting on the substrate. During this time, there has been a problem with conventional cover tape 120 that the IC chips 110 pop out from the pockets 100A due to absorption at low-pressure and static electricity, etc.

For this reason, cover tapes on which openings 125 or openings 126 are formed as shown in FIGS. 1E and 1G (Japanese Patent Application Laid-Open (JP-A) No. 4-031215 and 2005-132421) and a cover tape on which projections 127 are formed as shown in FIG. 1I (JP-A No. 2005-35636) have been proposed. These cover tapes 120 inhibit popping out, etc. of the semiconductor devices (IC chips 110) which occurs during peeling off of the cover tapes 120 by decreasing the contact area between upper surface of the semiconductor devices (IC chips 110) and the cover tapes 120 with the openings 125, the openings 126 or the projections 127. However, when forming the projections 127, exclusive cover tape is needed for every pockets 100A pitch. Furthermore, it becomes necessary to make the depth of the pockets 100A as much deeper as the height "t" of the projections on the cover tape 120 on which the projections 127 are formed as shown in FIG. 1I and the cover tape 120 on which the openings 126 are formed in form of projection as shown in FIG. 1G. Further, when the openings 125 shown in FIG. 1E and the openings 126 shown in FIG. 1G are formed, an insulating layer 122 is in contact with or adjacent to the semiconductor device because end faces of the openings 125 and 126 of the cover tapes 120 are exposed as shown in cross-sectional views in FIGS. 1F and 1H. Generally, a sheet S prior to forming of cover tape 120 has a two-layer structure containing an insulating layer 121 and an antistatic layer 122 for material cost reduction as shown in FIG. 1D. Because the insulating layer 121, which takes over the most part of the sheet S, does not have conductive and antistatic functions, a problem of circuit destruction due to charged semiconductor device or dust generated from the end faces of the openings 125 and 126 which attaches to the semiconductor device during mounting on the substrate occurs as shown in FIGS. 1F and 1H.

In consequence, a cover tape for packaging semiconductor device which prevents generation of powder dust by inhibiting static electricity, ensures quality and reliability of a semiconductor device and is capable of improving the mounting speed of the semiconductor device by shipment in tape have not yet been provided and further development is desired.

It is an object of the present invention to solve foregoing problems and to fulfill the following purposes.

The purpose of the present invention is to provide a cover tape for packaging semiconductor device which ensures quality and reliability of a semiconductor device by protecting the outer shape of the semiconductor device, and is capable of improving the mounting speed of the semiconductor device by shipment in tape, and a package for semiconductor device using the cover tape for packaging semiconductor device.

SUMMARY OF THE INVENTION

The measures to solve above problems are as follows.

The cover tape for packaging semiconductor device of the present invention has a net-like structure at least in a portion and is pasted onto an embossed tape which contains a number of pockets containing semiconductor devices so as to cover the pockets.

Since the cover tape for packaging semiconductor device has the net-like structure at least in a portion, the contact area with the semiconductor device is decreased because of the multiple airspaces provided by the net-like structure and the airspaces exhibit ventilation function enabling to inhibit the popping out of the semiconductor devices caused by absorption at low pressure and static electricity, etc. which occurs during high-speed transportation and high-speed peeling. Therefore, the cover tape for packaging semiconductor device can ensure quality and reliability of a semiconductor device, is capable of improving the mounting speed of the semiconductor device by shipment in tape and can be suitably used for shipment in tape of small-size package, particularly small, thin and light electronic components such as CSP/CHIP.

The package for semiconductor device of the present invention contains an embossed tape which has a number of pockets containing semiconductor devices and a cover tape for packaging semiconductor device of the present invention.

Since the package for semiconductor device uses the cover tape for packaging semiconductor device of the present invention, it is possible to transport the semiconductor device while ensuring its quality and reliability and the package for semiconductor device can be suitably used for high-speed transportation of the electronic components such as the semiconductor device by shipment in tape.

DESCRIPTION OF THE PREFERRED EMBODIMENTS

The cover tape for packaging semiconductor device of the present invention will be explained in detail referring to figures below.

First Embodiment

The first embodiment of the cover tape for packaging semiconductor device of the present invention will be explained referring to figures below.

Figure 2A:
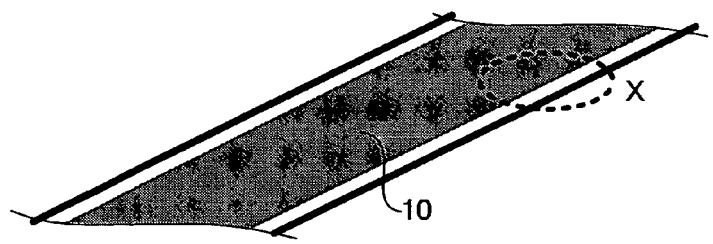
FIG. 2A is a perspective view showing the cover tape for packaging semiconductor device of the present invention in the first embodiment.

FIG. 2A is a perspective view showing the cover tape for packaging semiconductor device of the present invention in the first embodiment.

Figure 1A:
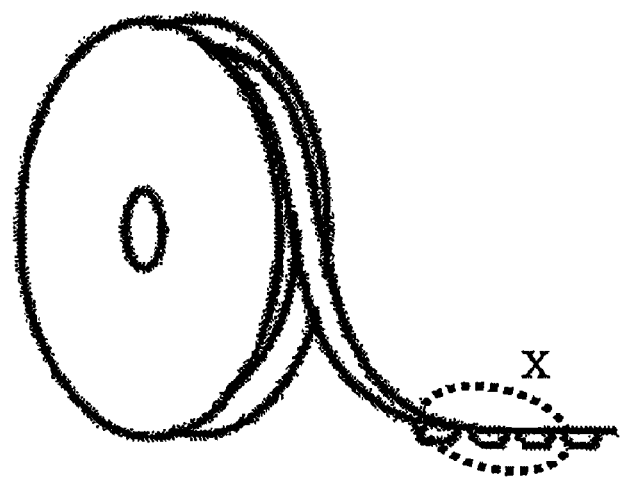
FIG. 1A is a photograph showing an overall view of an exemplary embossed tape and cover tape wound on a reel.
Figure 1B:
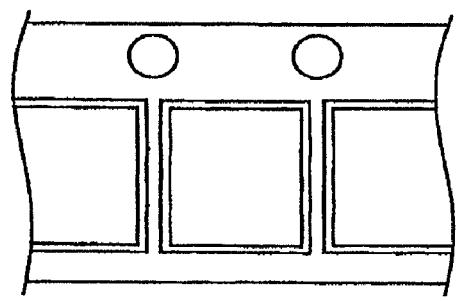
FIG. 1B is a photograph showing a plain view of the embossed tape and the cover tape of FIG. 1A.
Figure 1C:
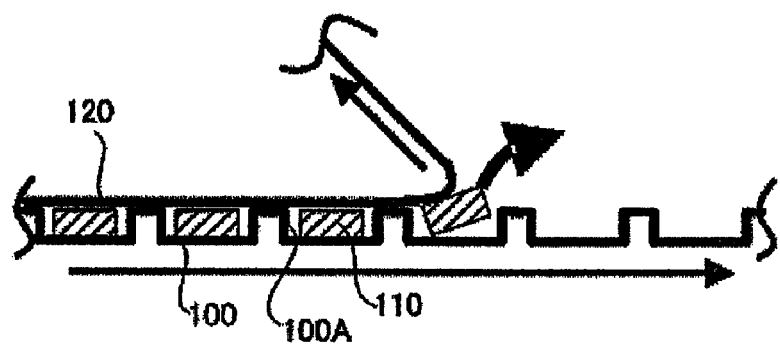
FIG. 1C is a schematic cross-sectional view showing the embossed tape and the cover tape shown in FIGS. 1A and 1B.
Figure 1D:
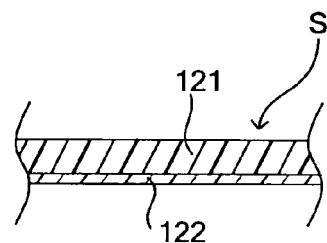
FIG. 1D is a schematic cross-sectional view showing an exemplary layer composition of the conventional cover tape.
Figure 1E:
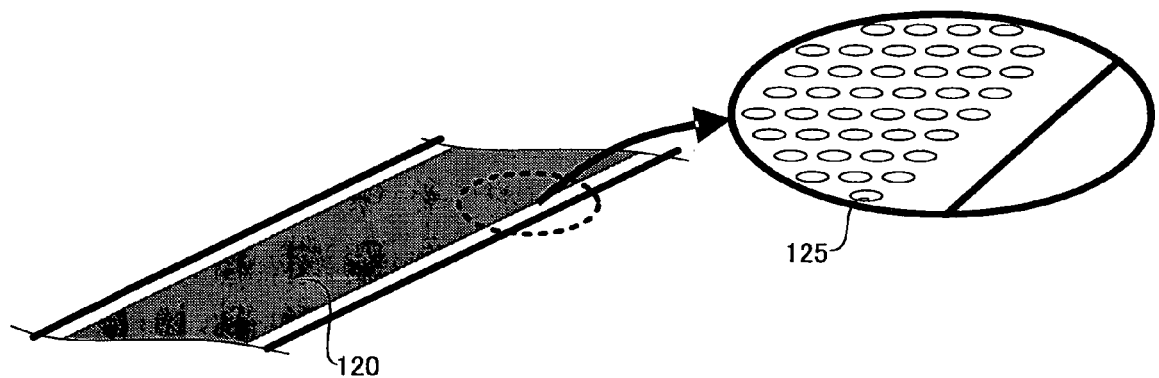
FIG. 1E is a perspective view showing an example (first view) of the conventional cover tape of an aspect in which openings are disposed on the cover tape.
Figure 1F:
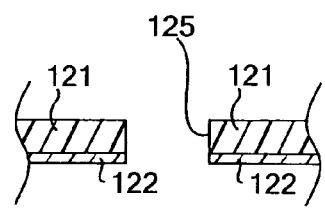
FIG. 1F is a schematic cross-sectional view showing the cover tape shown in FIG. 1E.

A cover tape 10 as shown in FIG. 2A is pasted on the embossed tape for use. The embossed tape is not particularly limited and may be selected from known embossed tapes accordingly. Examples include an embossed tape 100 as shown in FIG. 1C on which pockets (concave portions) 100A are formed at regular intervals in a length direction for containing semiconductor devices (IC chips 110, for example). The cover tape 10 prevents dropout of semiconductor devices (IC chips 110, for example) contained in the pockets 100A on the embossed tape 100 when pasted on the embossed tape 100. Furthermore, the cover tape 10 is shipped and transported as wound on reels with the embossed tape 100 (FIG. 1A). The semiconductor device mentioned here is not particularly limited and may be selected accordingly. It is preferably small, thin and light electronic components such as CSP/CHIP, etc. and examples include LSIs and condensers.

Figure 2B:
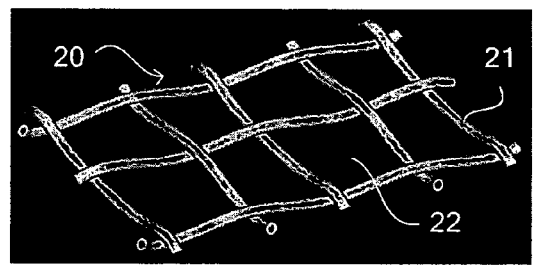
FIG. 2B is a schematic diagram showing a net-like structure of the cover tape for packaging semiconductor device of the present invention in the first embodiment.

FIG. 2B is a partially enlarged view showing the X portion surrounded by dotted lines in the cover tape 10 of FIG. 2A. The cover tape 10 has a net-like structure 20 as shown in FIG. 2B, and the net-like structure 20 is formed of a string-like member 21 woven in a grid pattern.

The shape, size, thickness and constituent material of the cover tape 10 are not particularly limited and may be selected accordingly. Because of the net-like structure 20 contained in the cover tape 10, the contact area with semiconductor device is decreased and absorption at low pressure and static electricity can be prevented.

The net-like structure 20 is not particularly limited and may be selected accordingly as long as it has multiple airspaces for ventilation function and examples include a structure formed of the string-like member 21 woven in a grid pattern. The net roughness of the net-like structure 20 is not particularly limited and may be adjusted accordingly. The net-like structure preferably has a roughness to some degree without causing peeling off in terms of decreasing the contact area with the semiconductor device.

The location of formation of the net-like structure 20 in the cover tape 10 is not particularly limited and may be selected accordingly. The net-like structure 20 may be formed in the entire cover tape 10 or formed locally so as to be located only above the pockets where semiconductor devices are contained when pasted on the embossed tape.

The width of the string-like member 21 is not particularly limited and may be selected accordingly. Further, method for weaving the string-like member 21 to form net-like structure 20 is not particularly limited and may be selected accordingly and examples include plain weaving.

The shape of the cover tape 10 is not particularly limited and may be selected accordingly. It is preferably in form of strips and the vertical cross section preferably has irregularity relative to the horizontal plane. If the vertical cross section has irregularity, it is possible to decrease the contact area between the cover tape 10 and the semiconductor device.

The size of the cover tape 10 is not particularly limited and may be adjusted corresponding to the size of the embossed tapes and the pockets.

The thickness of the cover tape 10 is not particularly limited and may be adjusted accordingly. It is preferably thin because it eliminates the need for designing the pocket depth deeper.

The constituent material for the cover tape 10 is not particularly limited and may be selected accordingly. The cover tape 10 is preferably made of an insulating layer and an antistatic layer which covers the insulating layer.

The material (insulating material) for the insulating layer is not particularly limited and may be selected accordingly and examples include PET (polyethylene terephthalate).

The material (antistatic material) for the antistatic layer is not particularly limited and may be selected accordingly. Examples include PE (polyethylene) to which antistatic agent is applied or kneaded in.

The cover tape 10 may have a net-like structure 20 made of an insulating layer formed of woven string-like member 21 made of the insulating material and the net-like structure 20 may be coated with an antistatic layer made of the antistatic material. For example, the cover tape 10 may have a net-like structure 20 formed of a woven fibrous (string-like) member (hereinafter, may be referred to as "cover tape material") 21 having a core-shell structure containing an inner layer (insulating layer) 21A formed of the insulating material and an outer layer (antistatic layer) 21B formed of the antistatic material as shown in the cross-sectional view of FIG. 2C. In these cases, since the cover tape 10 formed of the woven string-like member 21 is in woven form, and small irregularity (the crossings of the string-like member 21 corresponds to the convex portions) and openings 22 are formed naturally by crossings of the string-like member 21, it is possible to omit forming of projections 127 or openings 125 and 126 which are required for conventional cover tape 120 as shown in FIGS. 1E to 1I, allowing simplification of manufacturing process.

Moreover, the insulating layer is not exposed as in the case of conventional cover tape 120 shown in FIGS. 1E to 1H because the insulating layer is coated with the antistatic layer. Therefore, the insulating layer does not come near and/or in contact with the semiconductor device and the cover tape 10 excels in protection for outer shapes and circuits of the semiconductor devices compared to the conventional cover tape 120.

Figure 1G:
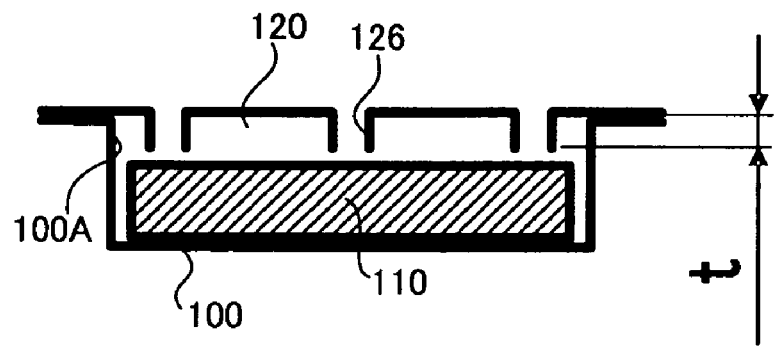
FIG. 1G is a cross-sectional view showing an example (second view) of the conventional cover tape of an aspect in which openings in form of projection are disposed on the cover tape.
Figure 1H:
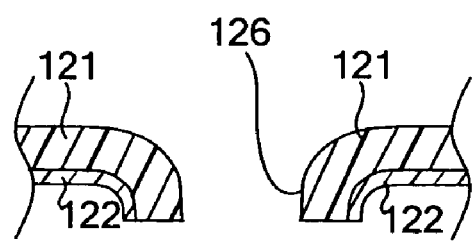
FIG. 1H is a schematic cross-sectional view showing the cover tape shown in FIG. 1G.
Figure 1I:
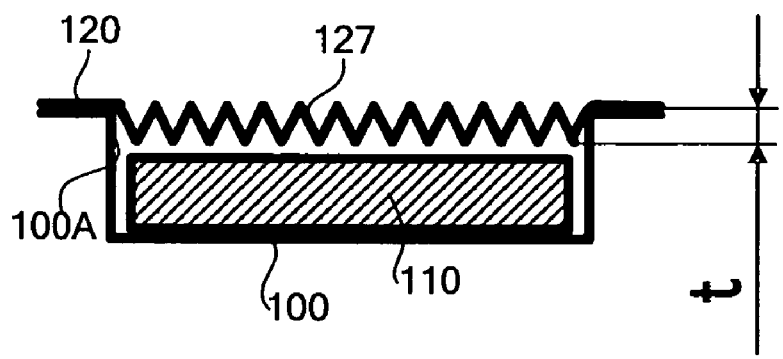
FIG. 1I is a cross-sectional view showing an example (third view) of the conventional cover tape of an aspect in which projections are disposed on the cover tape.
Figure 2C:
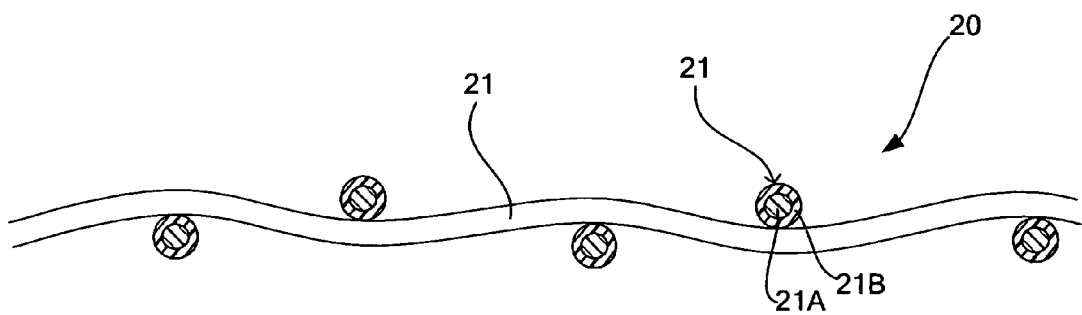
FIG. 2C is a schematic cross-sectional view showing the cover tape for packaging semiconductor device of the present invention in the first embodiment.

Furthermore, it is necessary to make the depth of the pockets 100A as much deeper as the height "t" of the projections in the conventional cover tape 120 shown in FIGS. 1G to 1I and the number of semiconductor device contained per 1 reel is decreased. However, because irregularity of the vertical cross section relative to the horizontal plane in the cover tape for packaging semiconductor device of the present invention is small, designing the pocket depth deeper is not necessary and in addition, the cover tape for packaging semiconductor device of the present invention is applicable for any pocket pitch.

Since the cover tape for packaging semiconductor device in the first embodiment has the net-like structure, the contact area with the semiconductor device is small and ventilation function is exhibited, thereby inhibiting popping out of semiconductor devices caused by absorption at low pressure and static electricity, etc. which occurs during high-speed transportation and high-speed peeling.

Moreover, because the insulating layer does not come near and/or in contact with the semiconductor device, it is possible to ensure quality and reliability of a semiconductor device by preventing circuit destruction caused by frictional electrification with the semiconductor device. And it is also possible to prevent dust generated from end faces of openings from attaching to the lead terminals of the semiconductor device and the substrate during mounting, as in the case of the conventional cover tapes.

Furthermore, height of the irregularity forming the net-like structure is small, thereby eliminating the need for designing pockets deeper and allowing the number of semiconductor devices contained per 1 reel to increase.

Further, the cover tape for packaging semiconductor device in the first embodiment can be suitably used as a package for semiconductor device by pasting onto the embossed tape which has been selected accordingly.

By the present invention, it is possible to solve foregoing problems and to provide a cover tape for packaging semiconductor device which ensures quality and reliability of a semiconductor device by protecting the outer shape of the semiconductor device, and is capable of improving the mounting speed of the semiconductor device by shipment in tape, and a package for semiconductor device using the cover tape for packaging semiconductor device.

The cover tape for packaging semiconductor device of the present invention can ensure quality and reliability of a semiconductor device by protecting the outer shape of the semiconductor device, and improve the mounting speed of the semiconductor device by shipment in tape. Therefore, the cover tape for packaging semiconductor device of the present invention can be suitably used for shipment in tape of small-size package, particularly small, thin and light electronic components such as CSP/CHIP, etc. of the semiconductor device and for the package for semiconductor device of the present invention in particular.

The package for semiconductor device of the present invention can transport the semiconductor device while ensuring quality and reliability of the electronic components of the semiconductor device and can be suitably used for high-speed transportation of the semiconductor device by shipment in tape.

What is claimed is:

1. A cover tape including a first outermost surface and a second surface opposite to the first outermost surface for packaging semiconductor devices, which is pasted onto an embossed tape comprising a number of pockets containing semiconductor device so as to cover the pockets, comprising:
a net-shaped structure at least in a portion of the first outermost surface facing the pockets of the embossed tape, wherein the net-shaped structure is formed of a woven string-shaped member and has irregularities on the first outermost surface of the cover tape,
wherein the cover tape for packaging semiconductor device has ventilation openings penetrating the cover tape from the first outermost surface to the second surface.

2. The cover tape for packaging semiconductor devices according to claim 1, wherein the string-shaped member comprises an insulating material which is coated with an antistatic material.

3. The cover tape for packaging semiconductor devices according to claim 2, wherein the string-shaped member comprises the insulating material, and a grid insulating layer, which is formed of the woven string-shaped member, is coated with an antistatic layer comprising the antistatic material.

4. The cover tape for packaging semiconductor devices according to claim 1, wherein the net-shaped structure is located only in an area corresponding to the pocket of the embossed tape.

5. A package for semiconductor devices, comprising:
an embossed tape; and
a cover tape including a first outermost surface and a second surface opposite to the first outermost surface for packaging the semiconductor devices,
wherein the embossed tape comprises a number of pockets which contain the semiconductor devices, and the cover tape for packaging semiconductor devices, which is pasted onto the embossed tape so as to cover the pocket, comprises:
a net-shaped structure at least in a portion of the first outermost surface facing the pockets of the embossed tape, wherein the net-shaped structure is formed of a woven string-shaped member and has irregularities on the first outermost surface of the cover tape,
wherein the cover tape for packaging semiconductor device has ventilation openings penetrating the cover tape from the first outermost surface to the second surface.

6. The package for semiconductor devices according to claim 5, wherein the string-shaped member comprises an insulating material which is coated with an antistatic material.

7. The package for semiconductor devices according to claim 6, wherein the string-shaped member comprises the insulating material, and a grid insulating layer, which is formed of the woven string-shaped member, is coated with an antistatic layer comprising the antistatic material.

8. The package for semiconductor devices according to claim 5, wherein the net-shaped structure is located only in an area corresponding to the pocket of the embossed tape.

9. A cover tape including a first outermost surface and a second surface opposite to the first outermost surface for packaging semiconductor devices, which is pasted onto an embossed tape comprising a number of pockets containing semiconductor device so as to cover the pockets, comprising:
a net-shaped structure at least in a portion of the first outermost surface facing the pockets of the embossed tape, wherein the net-shaped structure is formed of a woven string-shaped member and has irregularities on the first outermost surface of the cover tape,
wherein the cover tape for packaging semiconductor device has ventilation openings penetrating the cover tape from the first outermost surface to the second surface, and
wherein the string-shaped member comprises an insulating material, and an antistatic material is applied to or kneaded in the insulating material.

10. The cover tape for packaging semiconductor devices according to claim 9, wherein the antistatic material is polyethylene.

11. A package for semiconductor devices, comprising:
an embossed tape; and
a cover tape including a first outermost surface and a second surface opposite to the first outermost surface for packaging the semiconductor devices,
wherein the embossed tape comprises a number of pockets which contain the semiconductor devices, and
the cover tape for packaging semiconductor devices, which is pasted onto the embossed tape so as to cover the pocket, comprises:
a net-shaped structure at least in a portion of the first outermost surface facing the pockets of the embossed tape, wherein the net-shaped structure is formed of a woven string-shaped member and has irregularities on the first outermost surface of the cover tape,
wherein the cover tape for packaging semiconductor device has ventilation openings penetrating the cover tape from the first outermost surface to the second surface, and
wherein the string-shaped member comprises an insulating material, and an antistatic material is applied to or kneaded in the insulating material.

12. The package for semiconductor devices according to claim 11, wherein the antistatic material is polyethylene.

* * * * *